United States Patent
Porat et al.

(10) Patent No.: US 6,922,436 B1
(45) Date of Patent: Jul. 26, 2005

(54) METHOD AND APPARATUS FOR CLOCK TIMING RECOVERY IN χDSL PARTICULARLY VDSL MODEMS

(75) Inventors: Boaz Porat, Haifa (IL); Amnon Harpak, Holon (IL); Shimon Peleg, Hod-Hasharon (IL)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/623,952
(22) PCT Filed: Mar. 18, 1999
(86) PCT No.: PCT/IL99/00154
§ 371 (c)(1), (2), (4) Date: Dec. 21, 2000
(87) PCT Pub. No.: WO99/48219
PCT Pub. Date: Sep. 23, 1999

(30) Foreign Application Priority Data

Mar. 19, 1998 (IL) ................................................ 123739

(51) Int. Cl.$^7$ .......................... H04B 1/38; H04L 27/14; H03D 3/18
(52) U.S. Cl. ....................... 375/222; 375/326; 375/328
(58) Field of Search .............................. 375/222, 326, 375/328, 329, 344, 356, 364, 232, 346, 332; 329/307, 308

(56) References Cited

U.S. PATENT DOCUMENTS

| | | | |
|---|---|---|---|
| 5,163,044 A | 11/1992 | Golden | ...................... 370/32.1 |
| 5,222,077 A | 6/1993 | Krishnan | ...................... 375/39 |
| 5,331,670 A | 7/1994 | Sorbara et al. | ............. 375/111 |
| 5,612,975 A | * 3/1997 | Becker et al. | ............... 375/319 |
| 6,167,095 A | * 12/2000 | Furukawa et al. | .......... 375/285 |
| 6,249,557 B1 | * 6/2001 | Takatori et al. | ............. 375/355 |
| 6,308,057 B1 | * 10/2001 | Hayashi | ...................... 455/324 |
| 6,449,325 B1 | * 9/2002 | Limberg | ...................... 375/364 |
| 6,526,101 B1 | * 2/2003 | Patel | ..................... 375/240.28 |

* cited by examiner

Primary Examiner—Temesghen Ghebretinsae
Assistant Examiner—Sam K. Ahn
(74) Attorney, Agent, or Firm—Baker Botts LLP

(57) ABSTRACT

Method and modem for fast timing recovery of transmitted data between a master χDSL modem and a slave χDSL modem, over a noisy, high loss, high distortion wiring. Transmitted QAM symbols are received and sampled at the slave modem. The sampled data is split into in-phase and quadrature channel, each of which is filtered by matched filter. The filtered outputs are sampled at twice the symbol rate and the lower and upper band edge components are extracted by modulating each of the sampled sequences of outputs with two discrete time sequences: $\cos(0.5\,\pi\,n) = \ldots 1, 0, -1, 0 \ldots$ and $\sin(0.5\,\pi\,n) = \ldots 0, 1, 0, -1 \ldots$. Each of the resulting products is filtered with a first order low-pass filters and re-sampled again at the symbol rate. The Bit Error Rate is computed, and the slave modem switches from blind timing recovery mode, to data directed timing recovery mode, after the Bit Error Rate has sufficiently decreased.

12 Claims, 6 Drawing Sheets

METHOD AND APPARATUS FOR CLOCK TIMING RECOVERY IN χDSL PARTICULARLY VDSL MODEMS

FIELD OF THE INVENTION

The present invention relates to digital data communication between two locations over the connecting wiring. More particularly, the invention relates to the use of Very High speed Digital Subscriber Loop (VDSL) modems for transferring data at high rates between two locations connected at least partially by conventional, twisted copper wires.

BACKGROUND OF THE INVENTION

The art has devoted considerable attention to the problem of transmitting data in a high rate between users being at different locations. Such users, may be home Personal Computers (PCs), office desktop workstations, cable television broadcasting services, Local Area Networks (LANs) and others. In some applications users are connected to each other by modems (modulator-demodulator) which encode the digital data to be delivered from one point (user) to another point and transmit the encoded data through a data link which may be, for instance, an analog communication channel. Such data comprises voice, digital video movies and software data files.

Digital Subscriber Loops (DSLs) comprise several technologies for high data rates, e.g., Asymmetric Digital Subscriber Loops (ADSLs), High speed Digital Subscriber Loops (HDSLs) and Very High speed digital Subscriber Loops (VDSLs). Generally, the whole family of DSLs is commonly known as χDSL. In some VDSL applications, like video transmission, data should be transmitted in very fast rates, usually up to 12.96 Mb/Sec or even exceed 25.92 Mb/Sec.

Analog modems were developed to deal with data rates up to 33.6 Kb/Sec. This rate is unacceptable for many applications, e.g., picture transmission where pictures are constructed from large data files. Digital modems which are developed to work on leased copper lines between two locations can reach higher data rates, up to 64 Kb/s or even 128 Kb/s. However, this rate is still too low for many applications. Any transmission medium interferes with the transmitted data by adding noise, by attenuating its amplitude, and by changing its phase. Digital modems suffer from these phenomena, reducing their ability to receive data without errors. Errors are critical in digital modems.

LANs are very intensively used to connect users, usually in the range of a single building but in many cases the range is expanded to several buildings. Since in many cases it is desired to connect users being in different buildings to share same data base, it is generally desired to exploit for this purpose an existing PSTN twisted pair line, or preferably a leased line. Moreover, in many cases it is desired to make high rate data communication between two LANs, for example, LANs of two offices located in different cities a hundred miles or more away from one another.

There are known connections that can provide higher bandwidth than twisted pair copper lines, for example, 10/100-Base-T coaxial cables and fiber-optic lines. The copper lines between PABXs were already replaced by fiber-optic lines in most cases, and have become standard. However, it is not foreseen that in the near future the twisted pair copper lines between the telephone end users and the PABXs be replaced, due to their hugh number, and to the complexity of replacing them. Therefore, it is desirable to provide a much higher rate modem communication on the relatively narrow bandwidth twisted pair copper lines. Significant efforts are now put in order to develop higher rate modems, which are commonly called in the art, VDSL modems.

Basically, the conventional unshielded copper wire twisted pair was originally designed to provide a medium for voice transmission, and when it is used in telephone communication its bandwidth is confined by filters in its two ends to between 300 Hz to 3.4 KHz. In leased lines, a wider bandwidth is available, however the possible data rate is still limited by the fact that long lines introduce very large attenuation, especially in the higher range of the bandwidth, which exceeds 8 MHz in VDSL modem transmission. This relatively wide bandwidth is required to enable full duplex communication channel, utilizing the known Frequency Division Duplex (FDD). Moreover, telephone lines pass through switching exchanges conducted by the local telephone companies, and this may be a very noisy environment which disrupts the transmitted data.

Usually, digital χDSL modems utilize Quadrature Amplitude Modulation (QAM) techniques to encode data. In this technique, the transmitted information-carrying signal appears in pre-defined amplitude and phase states, each state representing a pre-determined number of bits, and is termed "a symbol". Conventional QAM techniques utilize 16 states (symbols) or 64 states. In case of 64-QAM, each symbol represents 6 bits. Therefore, for a desirable VDSL modem transmitting at a rate of 12.96 Mb/Sec, $2.16*10^6$ symbols have to be transmitted in each second. A one kilometer twisted pair line has a propagation delay (impulse response time) in the range of about 12 $\mu$Sec, whereas each symbol duration is 0.463 $\mu$Sec in the above case. Thus, the effective duration of the line impulse response is about 25 symbols. This long duration of the impulse response of the line leads to a severe Inter symbol Interference (ISI) which may result in a large errors at the receiving modem if cannot canceled, and practically limits the data rate.

The communication between two χDSL modems is carried out while one modem is the transmitter (master) and the other is the receiver (slave). Data directed to the slave modem are termed "downstream" while the data directed to the master modem are termed "upstream". Communication between the two modems requires synchronization between their timing clocks. Proper operation of χDSL systems requires almost perfect synchronization between master and slave clocks, which means that they must work at the same frequency. Any constant frequency offset leads to a constant growing phase error which may lead to mismatch between the number of transmitted and received symbols per time unit, which is unacceptable. Different clocks always have somewhat different frequencies due to manufacturing tolerances, aging (changes in their component characteristics versus time), temperature variations, power supply tolerances, random noise deviations, etc. Therefore, synchronization means are required in the slave modem to recover the master clock frequency (timing) from the transmitted symbols, together with a correction apparatus to lock the slave clock frequency to the master clock frequency.

One known method for synchronization between receiving and transmitting modem clocks is performed by the transmission of a pilot tone from the master modem to the slave modem. However, in case of pilot tone transmission the energy is concentrated in a single frequency, violating the Power Spectral Density (PSD) constraints and interfering with other systems operating in the same frequency range. It is generally desirable that the power of the synchronizing signal will be distributed on a wide frequency band, but usually these signals are not periodic. Therefore, using distributed power signals for synchronization of χDSL systems is problematic.

Considering the aforementioned problems, an χDSL system is required to synchronize in "blind" mode, which means operating in a very noisy environment when initially there is no information about the transmitted symbols at the receiving modem. This mechanism is known as Blind Timing Recovery (BTR). It is characterized by the fact that all symbols have equal probabilities and some or most of them are attenuated, resulting in a very bad signal to Noise Ratio (SNR) and/or being received with a random phase-shift and with high additive noise. BTR algorithms face significant difficulties when trying to reconstruct the master clock. Thus, an effective error correction mechanism is required, without reducing the data rates.

Several suggested solutions for BTR have been proposed. "Passband Timing Recovery in an All-Digital modem receiver" by D. Godard, *IEEE Transactions on Communications.* Vol. COM-26. No. 5, 1978, p.p. 517–523, the disclosure of which is incorporated herein by reference describes a method of performing BTR. However, this reference does not provide a mathematical proof, or show any means for carrying it out.

An effort to carry out Godard's method is discussed in "Joint Blind Equalization, Carrier Recovery, and Timing Recovery for High Order QAM Signal Constellation", *IEEE Transactions on Signal Processing,* Vol. 40, No. 6, 1992, p.p. 1383–1398 the disclosure of which is also incorporated herein by reference. This reference describes means for performing BTR by applying a complicated algorithm, based on Godard's theory. Particularly, these means require complicated hardware having extremely high processing power.

It is an object of the present invention to provide a synchronization method useful for fast bi-directional data transmission, between χDSL modems over conventional unshielded copper or the like wiring, for example connecting LANs.

It is another object of the present invention to provide a simple fast method for accurately recovering the clock frequency of the transmitting χDSL modem at the receiving modem, without the need of a predetermined training sequence.

It is another object of the invention to provide a method for fast synchronization of the receiving χDSL modem clock to the transmitting χDSL modem clock, while operating in blind mode It is still another object of the invention to provide adaptive, fast converging error correction apparatus for carrying out the method of the invention.

Other objects and advantages of the invention will become apparent as the description proceeds.

SUMMARY OF THE INVENTION

The invention is directed to a method for fast timing recovery of transmitted data between two χDSL modems, said data is transferred trough a noisy, high loss, high distortion wiring, comprising the steps of:
a) Providing a master χDSL modem, synchronized by its own timing clock, for data transmission to a second slave χDSL modem;
b) Providing a second slave χDSL modem, synchronized by its own timing clock, for data reception from said master χDSL modem;
c) Providing a communication wiring connecting said master modem to said slave modem;
d) Encoding and transmitting the desired data as a sequence of symbols to the slave modem using predetermined QAM states;
e) Receiving the transmitted symbols at the slave receiver (demodulator);
f) Sampling the received signal;
g) Splitting the sampled data to in-phase (I) and quadrature (Q) channels;
h) Filtering each channels of step g) above with digital low-pass filters, said filters being matched to the transmitting filters at the master modem;
i) Turning the master clock timing recovery into blind mode, by the steps of:
  (1) Sampling the filtered I and Q outputs at twice the symbol rate;
  (2) Extracting the lower and upper band edge components by modulating each of the sampled sequence of I and Q outputs of step (1) above with two discrete time
  $\cos(0.5\pi n)=\ldots, 1,0,-1,0,\ldots$
  sequences:
  $\sin(0.5\pi n)=\ldots, 0,1,0,-1,\ldots$
  (3) Filtering the four resulting products with four first order low-pass filters and re-sampling the results at the symbol rate;
  (4) Computing the real and imaginary parts of the spectral line vector using the products of step (3) above;
  (5) Filtering both the real and the imaginary parts of step (4) above, using another first order low-pass filter;
  (6) Normalizing the magnitude of the spectral line vector unity using a suitable automatic gain control circuitry;
  (7) Extracting the phase of the spectral line vector from the normalized imaginary part of step (6) above;
  (8) Feeding the sampled imaginary part of step (7) above as a phase-error signal to a controller of a phase-locked loop (PLL), said PLL utilizing a frequency controlled clock oscillator, the frequency of which is tuned to track the frequency of the incoming symbols (the master modem clock frequency);
  (9) Converting the digital control word to analog control voltage supplied to the tracking oscillator of step (8) above, using a Digital to Analog Converter (DAC); and
  (10) Using a secondary accumulator to correct the control word supplied to the DAC of step (9) above;
j) Feeding the I and Q filtered outputs to a complex linear equalizer for coarse phase and amplitude error correction;
k) Computing the symbol state data decisions using a slicer circuitry;
l) Fine equalization of the channel distortions by feeding the I and Q outputs of the slicer to a decision feedback equalizer, the outputs of which are extracted from the slicer I and Q inputs, respectively;
m) Computing the extracted symbols error rate at the slicer outputs; and
n) After the error probability decreases to a given Bit Error Rate (BER), switching from blind mode timing recovery to data directed timing recovery mode.

According to a preferred embodiment of the invention the transmission medium is a pair of copper wires, which may be a telephone line. High data rates may be transmitted on relatively long conventional telephone lines, occupying corresponding frequency bands. The timing oscillator of the receiving modem may be a Voltage-Controlled Crystal Oscillator (VCXO), utilized by a phase-locked loop.

According to a preferred embodiment of the invention, blind timing recovery is achieved using a reduced constellation that includes only equal amplitude symbols. This reduced constellation simplifies and accelerates the equalizing process. Error correction process is performed to control the frequency of the PLL tracking oscillator. The error signal produces a digital correction signal which is converted to an analog control signal by a simple Digital to Analog Converter (DAC). Additional secondary accumulator circuitry is utilized to correct the input word to the DAC to attenuate frequency jitter, comprising the steps of:

a) Rounding the double precision control signal;

b) Generating an error signal between the double precision value and the rounded value;

c) Accumulating the error signal in a secondary accumulator;

d) Adding the error signal to the output signal of the secondary accumulator;

e) Comparing the result of step d) above with half the value of the DAC's Least Significant Bit (LSB);

f) Compensating the rounded value according to the result of step e) above by the steps of:

(1) Adding the value of the DAC's LSB to the accumulator output, if the output value is larger than half the value of the DAC's LSB; or (2) Subtracting the value of the DAC's LSB from the accumulator output, if the output value is smaller than half the value of the DAC's LSB;

Using this a simple DAC together with the digital compensation circuitry simplifies and reduces the cost of the control circuitry, and still maintains a stable, accurate control voltage to the VCXO.

BRIEF DESCRIPTION OF THE FIGURES

The above and other characteristics and advantages of the invention will be better understood through the following detailed description of preferred embodiments thereof, with reference to the appended figures, wherein.

DETAILED DESCRIPTION OF PREFERRED EMBODIMENTS

Figure 1:
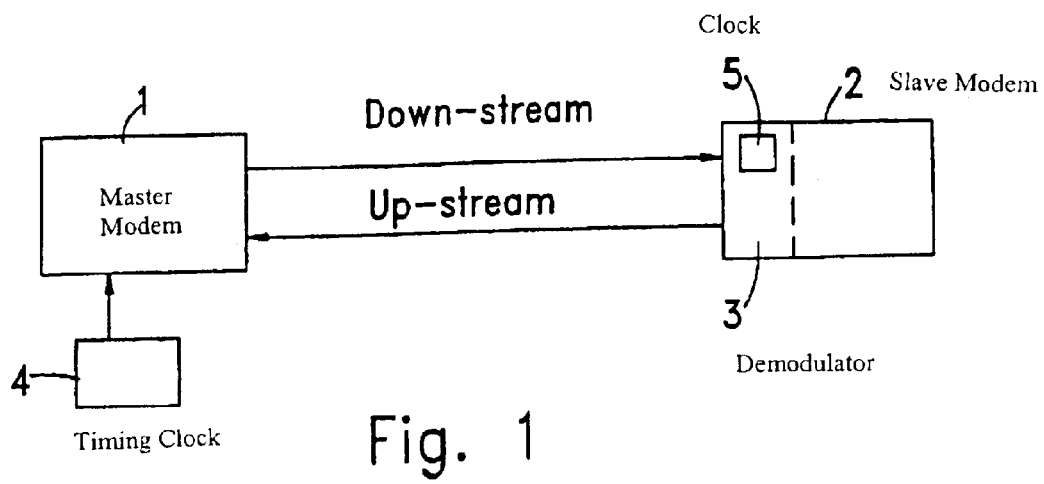
FIG. 1 schematically illustrates a full duplex data communication channel between master and slave χDSL modems.

FIG. 1 illustrates a full duplex data communication channel between master and slave χDSL modems, using standard telephone line made from copper wires pair. A timing clock 4, which may be supplied by the local telephone system or by a Synchronous Digital Hierarchy (SDH) system, drives the master modem to transmit data (symbols) downstream to the slave modem 2. The slave modem is driven by another clock 5, which is a part of the slave's demodulator 3. Clock 5 should be synchronized to clock 4 since the clock defines the difference between symbols. After synchronization, clock 5 times the downstream symbol reception and upstream symbol transmission to the master modem.

Figure 2A:
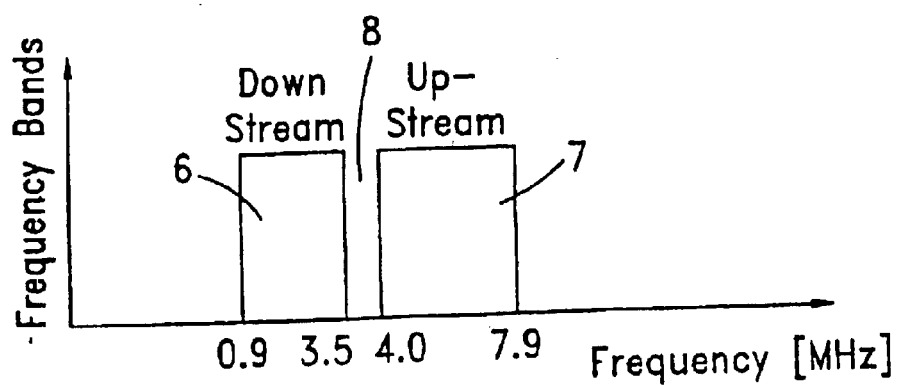
FIG. 2A is a graph of typical frequency bands occupied by VDSL transmission.

The frequency spectrum of an χDSL channel utilizes two separated frequency bands using Frequency Division Duplex (FDD) as shown in FIG. 2A. The first band 6 occupies the range from 0.9 MHz to 3.5 MHz and is used for down-stream transmission, whereas the second band 7, occupies the range from 4 to 7.9 MHz and is used for up-stream transmission. A 500 KHz Guard-Band (GB) 8 remains unused (by χDSL systems) due to amateur radio interference constraints.

Figure 2B:
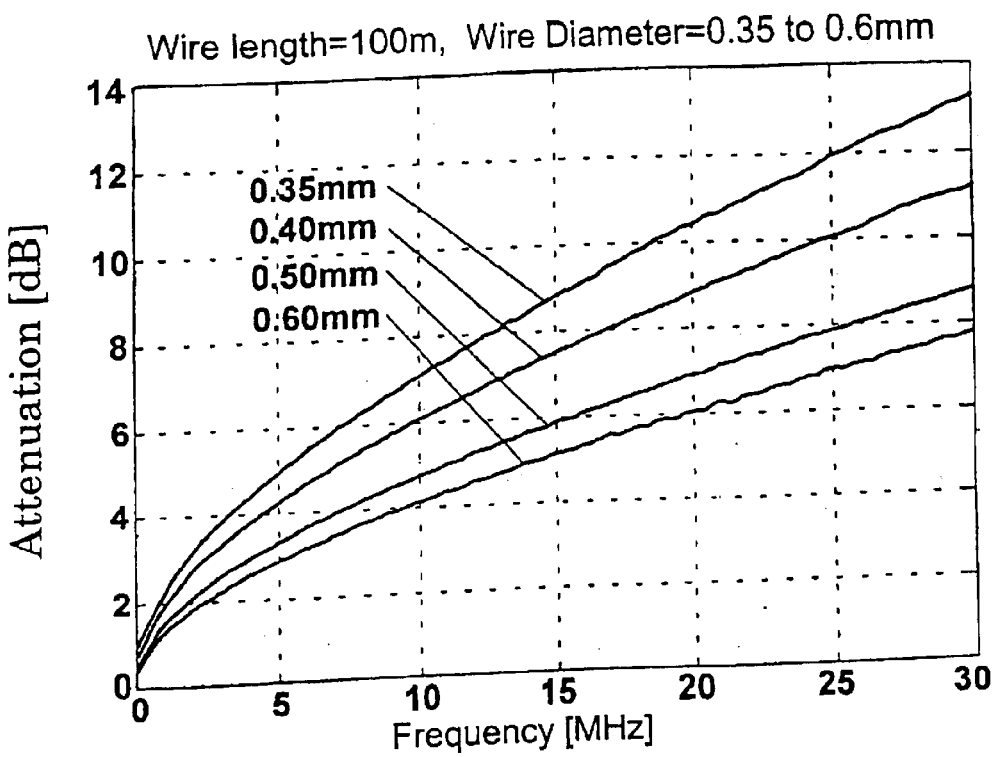
FIG. 2B is a graph of the attenuation of a typical copper wire communication line.

FIG. 2B shows the attenuation of typical copper lines for common diameters (0.35, 0.4, 0.5, and 0.6 mm). From the figure, it can be seen that a typical, 100 m long, telephone line with 0.4 mm copper wire diameter has large attenuation characteristics with sharp attenuation from low to high frequencies. Thus, transmitted symbols propagating along a 1 Km long line reach the slave modems with power attenuation of up to 50 dB. Moreover the line causes a substantial shift of the symbols phase. In addition, since the line passes through switching junctions and other telephone service paths, a lot of noise and cross-talk are added to the attenuated symbols. All these factors distort the amplitude and phase characteristics of the transmitted symbols, making the task of their timing recovery very complicated.

The attenuation of the line is smaller at the downstream band. Therefore, the BTR process at the slave modem can work with a better SNR than by working on the upstream data. By the SNR consideration, downstream data is encoded with 64-state QAM whereas upstream data is encoded with only 16-state QAM. Basically, 16 QAM has better noise immunity than 64 QAM, but wider bandwidth.

Figure 3:
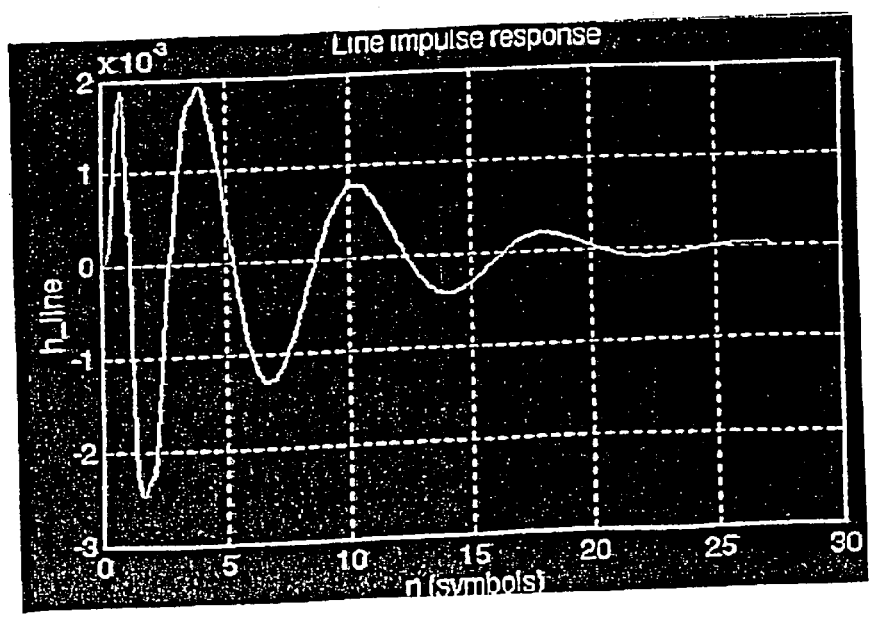
FIG. 3 is a graph of the Impulse-Response (IR) of the communication line of FIG. 2B.

FIG. 3 is a graph of the Impulse-Response (IR) of a 1 Km long line. The IR of a system represents the output of the system when applying a unit sample δ(n) at the input. It is seen that the IR lasts a time period equal to the duration of 25 symbols. Thus, large errors may occur at the slave modem. In addition, fast data rates require extremely fast processing speeds, which limits the complexity of the BTR that may be used.

Figure 4:
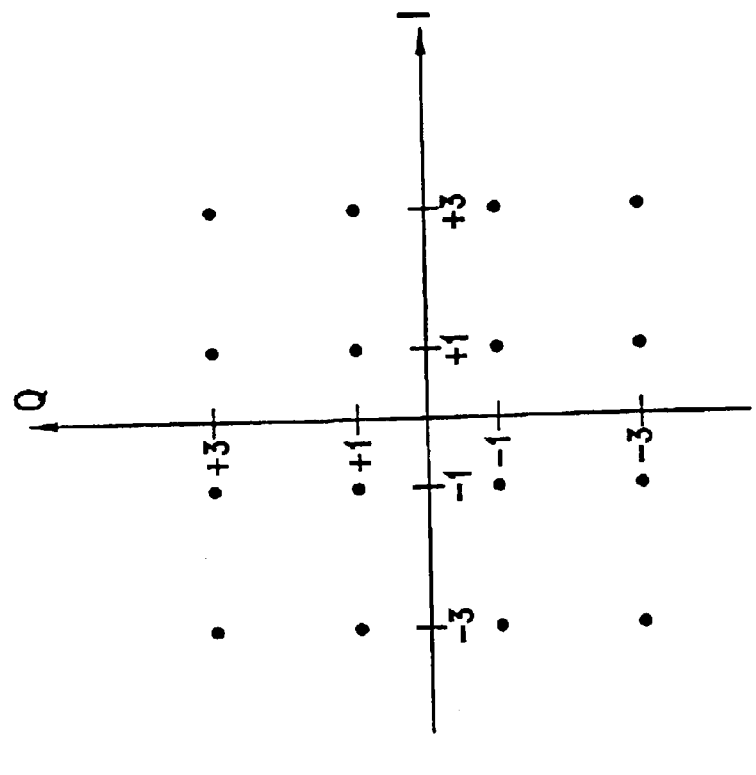
FIG. 4 illustrates a 16 QAM generation and the resulting 16 state constellation.
Figure 4:
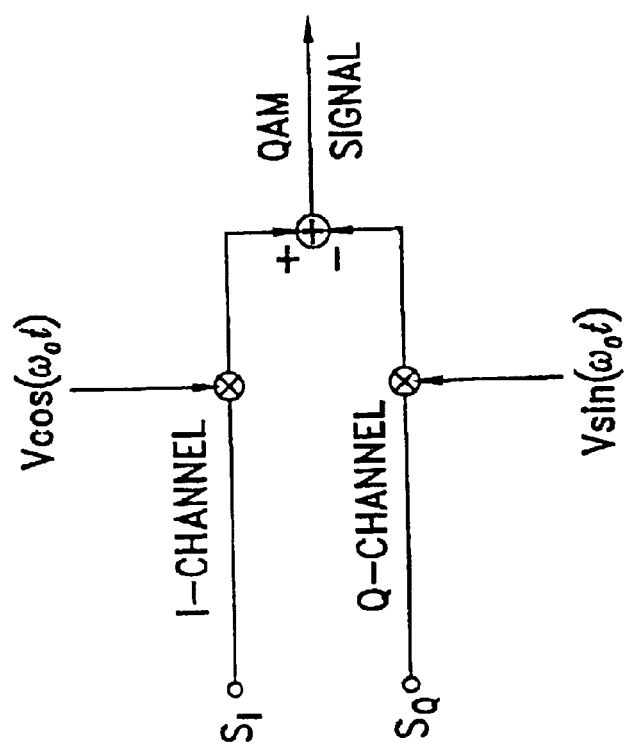

FIG. 4 illustrates a 16 QAM generation and the resulting state constellation. Two carriers V*cos($\omega_0$t) and V*sin($\omega_0$t), shifted by 90°, forming an In-phase channel (I-channel) and Quadrature channel (Q-channel) respectively, are modulated by two information signals $S_I$ and $S_Q$ respectively. Each signal $S_I$ or $S_Q$ assume four values; ±1 and ±3. I and Q channels are summed forming a 16 state QAM signal. These 16 states are distinguishable by their amplitude/phase combinations as illustrated in the constellation diagram in the complex plain. Each state is a vector (symbol) which is the sum of two vectors, I and Q. Since each of $S_I$ and $S_Q$ have four different amplitudes, each may represent four different logic combinations (00, 01, 10, 11). Thus, summations of their respective modulated carriers provide 16 different vectors (symbols), representing 16 logic combinations (0000, 0001, 0010, . . . , 1111).

Figure 5A:
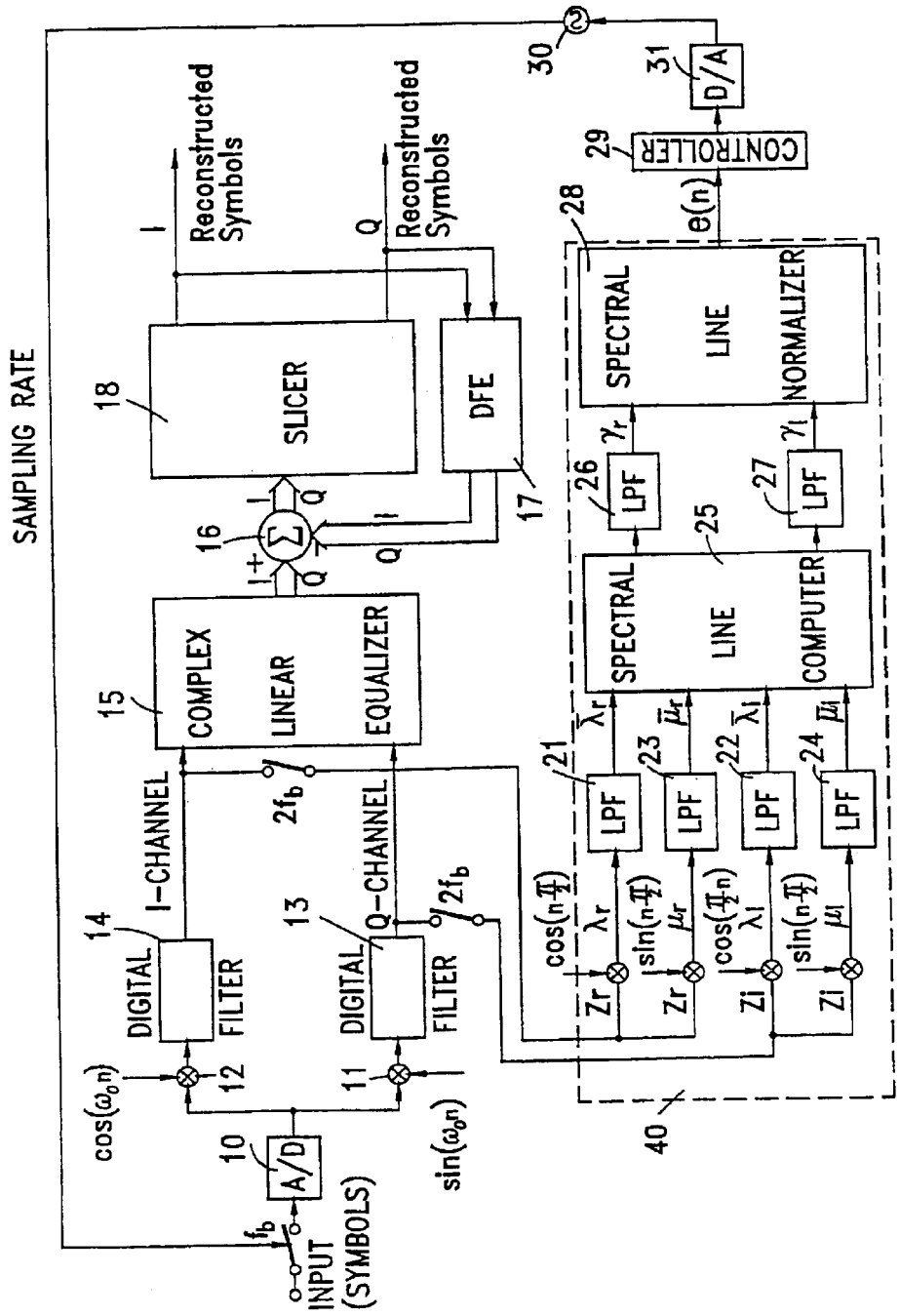
FIG. 5A is a block diagram of the demodulator of the slave modem.

FIG. 5A is a block diagram of the demodulator of the slave modem. Symbols are sampled and converted to a digital form by an analog to Digital (A/D) converter 10. The samples are fed into two multipliers 11 and 12, which are phase-shifted by 90°, forming the I and Q channels. These I and Q channels are filtered by Low Pass Filters (LPF) 13 and 14, respectively. These filters (commonly known as "Nyquist Filters") are identical, and similar filters exist in the master modem to give it a raised cosine shape. An excess bandwidth of approximately 20% results in these filters.

The filtered I and Q channels are fed into a complex Linear Equalizer (LEQ) 5, which functions as an adaptive filter for a coarse error correction mechanism. LEQ 5 is able to correct both amplitude and phase errors caused by the line. LEQ 5 feeds both I and Q corrections to a slicer 18, which provides a decision for any received symbol in order to classify each symbol to one of the ideal QAM states. The outputs from the slicer 18 are reconstructed symbols, which are fed back into the complex Decision Feedback Equalizer (DFE) 17, via the adder 16, into the slicer 18. The DFE provides an additional fine error correction mechanism which is adaptive according to the resulting errors from the slicer.

Figure 6:
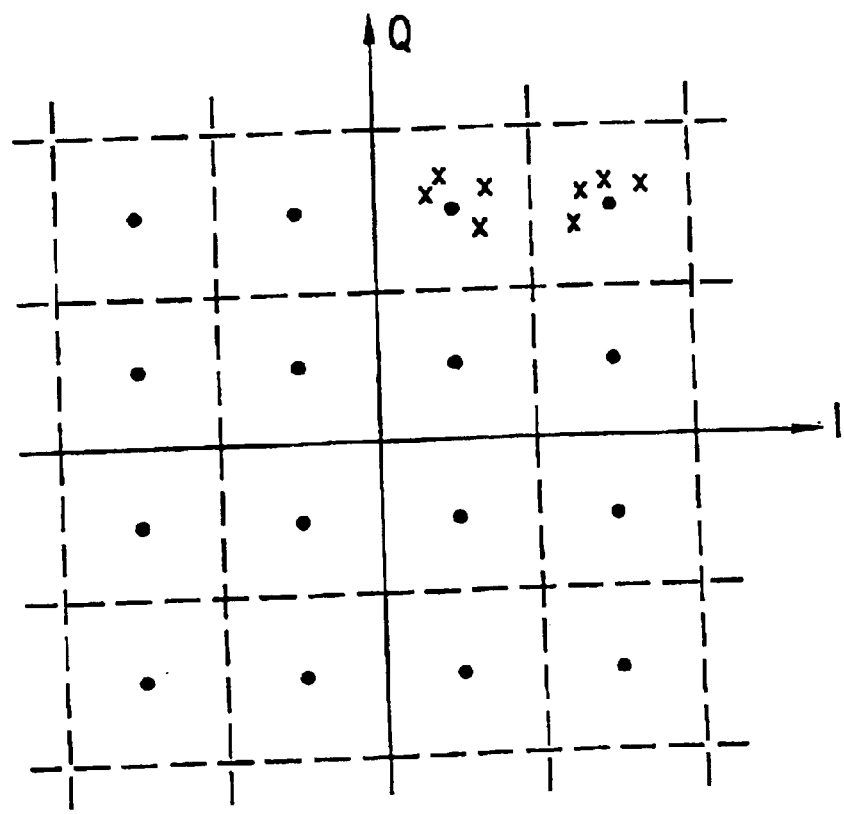
FIG. 6 schematically illustrates the output decisions of the slicer of FIG. 5A.

FIG. 6 illustrates the output of the slicer 18. The slicer 18 slices the I-Q complex plain to 16 identical squares. For each equalized (by LEQ 15) symbol that falls into one of these squares, a decision is taken to associate it to one of the states. In practice, each received symbol appears with an error in its amplitude as well as in its phase. As a result, all symbols that are associated with a state form a "cluster" around their state. Each DFE reads the errors (distance from the theoretical state) of each symbol, processing the information to predict a better correction step and feeds an input back to the slicer to reduce the error at the next symbol.

Looking back at FIG. 5A, a Timing Recovery Loop (TRL) 40 samples the information of both I and Q channels filtered by LPF 13 and 14 respectively, and provides an error signal e(n) which is fed to controller 29. The controller accepts the error signal and provides a correcting control voltage (in a direction that reduces the error signal) to a Voltage Controlled Crystal Oscillator (VCXO) 30 that determines the sampling rate of the incoming symbols. This sampling rate should follow the incoming symbol rate (synchronization) and therefore, the TRL 40 together with controller 29 and VCXO 30 are essentially a Phase-Locked Loop (PLL).

TRL 40 may function in two possible modes. The first mode is a blind mode which operates first, until the symbol error rate at the output of the slicer 18 is better than $10^{-3}$ or any other desired error-rate. After the desired error rate is obtained, the TRL switches to Decision Directed Timing Recovery (DDTR) mode, which is relatively simple and widely used in modems.

Generally, PLLs operate as Frequency Modulation (FM) demodulators. In this case, the frequency of the VCXO should follow the frequency of the master modem clock (incoming symbol rate). A PLL is used to lock the frequency of the timing clock of the slave to that of the master. Any change in the master clock frequency (FM), causes TRL 40 to generate an error signal and the controller reacts by forcing the control voltage of the VCXO to change its frequency to the new frequency. Thus, the VCXO control voltage detects the frequency changes of the master modem clock.

For a simpler and easier understanding of loop operation, a mathematical representation of the VCXO operation is provided below. The VCXO, which is the plant of the control loop, can be mathematically represented as an integrator, because its phase is proportional to the integral of the frequency and the control voltage of the VCXO determines the instantaneous frequency. Mathematically:

$$v_{vcxo}(t)=\sin[2\pi K_{vcxo}\int c(t)dt] \qquad [\text{Eq. 1}]$$

where c(t) is the VCXO control voltage, $v_{vcxo}(t)$ is the VCXO output voltage, and $K_{vcxo}$ is a proportionality constant.

The critical parameter of the VCXO is its instantaneous phase, which is given by:

$$\phi(t)=2\pi K_{vxco}\int c(t)dt \qquad [\text{Eq. 2}]$$

If $\phi_{in}(t)$ denotes the phase of the incoming signal, then the output of the TRL 40 (which functions as an error signal generator) is given by:

$$e(t)=\sin[\phi_{in}(t)-\phi(t)] \qquad [\text{Eq. 3}]$$

Here, the phase error is small and the approximation sinx ≈ x may be used. Hence, the phase error is given by $e(t)\approx\phi_{in}(t)-\phi(t)$ and both the VCXO 30 and the error signal generator are considered as Linear Time Invariant (LTI) systems. Therefore, the controller 29 may also be LTI.

The mathematical description of the above and of the following functions of the loop utilizes both continuous and discrete time analysis, for the sake of convenience. Since digital processing techniques are implemented, a sampling time interval $T_0$ of the incoming signals is defined, enables normalizing frequencies to the sampling frequency $1/T_0$ and expressing phase in terms of periods. Using the well known Laplace Transform (LT) for transforming time presentation of signals to s domain presentation (s=σ+jω, where $j^2=-1$), the transfer function of the VCXO is given by:

$$G(s)=\frac{2\pi K_{VCXO}}{s}. \qquad [\text{Eq. 4}]$$

Figure 7:
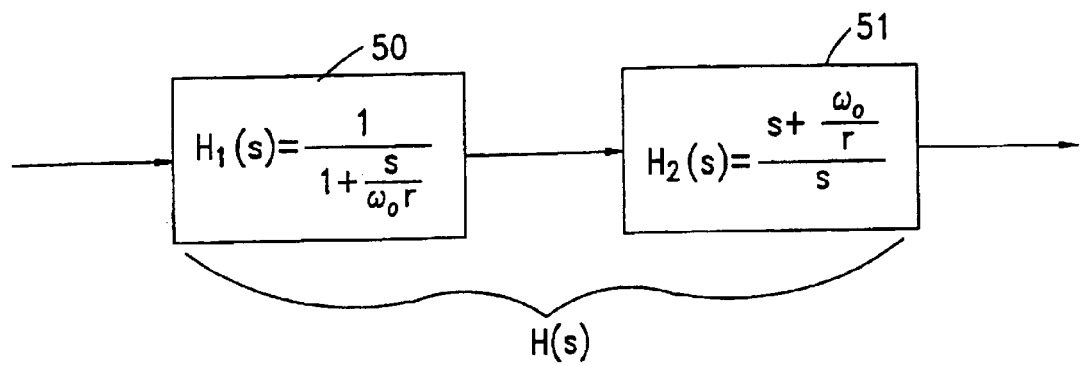
FIG. 7 is a block diagram of the controller of FIG. 5A.

FIG. 7 is a block diagram of the controller, comprising two functional blocks: an LPF 50, which attenuates the additive noise of the error signal e(t) and a proportional/integral controller 51, which provides a correction voltage proportional to the frequency offset between the VCXO and the master modem clock, reducing the steady state phase error to zero. In addition, an integrative controller smoothes the transition of the TRL from blind mode to DDTR mode. The expression of the controller transfer function in the s domain is given by:

$$H(s)=\frac{\omega_0}{2\pi K_{VCXO}}\cdot\frac{s+(\omega_0/r)}{s}\cdot\frac{1}{1+(s/\omega_0 r)}. \qquad [\text{Eq. 5}]$$

where $\omega_0$ is the loop cutoff frequency (the maximum frequency error that the loop is able to track) and r is the loop damping factor (an indication of the loop reaction and stability). The first expression of H(s) stands for constant gain, the second for proportional/integral part of the controller, and the last one stands for LPF. At the cutoff frequency $\omega_0$, the magnitude of the open loop transfer function is given by (for $s=j\omega_0$):

$$|G(j\omega_0)H(j\omega_0)|=1 \qquad [\text{Eq. 6}]$$

The denominator (knows as the characteristic polynomial) of the loop transfer function G(s) H(s) is given by:

$$P(s)=s^3+\omega_0 rs^2+\omega_0^2 rs+\omega_0^3. \quad [\text{Eq. 7}]$$

this cubic polynomial has one real root and two complex conjugate roots, which determine the damping factor r of the loop. For r<1 the loop is unstable (oscillatory) and for r≧3 the loop is overdamped.

According to another preferred embodiment of the present invention, r is chosen to be r=2.8. Since the loop is a PLL, there is a maximum frequency offset $\Delta f_{max}$ between the master modem clock and the VCXO for which the loop can achieve locking. According to a preferred embodiment of the present invention, $\omega_0$ is chosen to satisfy the condition $\omega_0 \geq 2\pi \Delta f_{max}$ to enable locking.

Rearranging the expression for H(s) a product of two factors gives: $H(s)=H_1(s) H_2(s)$, or $$H(s) := \frac{1}{1+\frac{s}{\omega_0 \cdot r}}\left(K_1 + \frac{K_2}{s}\right) \quad [\text{Eq. 8}]$$

where $$K_1 := \frac{\omega_0}{2\cdot \pi \cdot K_{VCXO}} \quad [\text{Eq. 9}]$$

$$K_2 := K_1 \cdot \frac{\omega_0}{r} \quad [\text{Eq. 10}]$$

According to a preferred embodiment of the present invention, $K_{vco}$ is chosen to be $K_{vco}=\Delta f_{max}$. This means that a unity control signal supplied to the VCXO is able to shift its frequency by $\Delta f_{max}$.

According another preferred embodiment of the present invention, $\omega_0$ is chosen to be:

$$\omega_0 = 2\pi \beta \Delta f_{max} \quad [\text{Eq. 11}]$$

where $1 \leq \beta \leq 2$. Hence, under the above selected conditions $K_1$ and $K_2$ are given by:

$$K_1 = \beta \quad [\text{Eq. 12}]$$

$$K_2 = \frac{2\pi \beta \Delta f_{max}}{r} \quad [\text{Eq. 13}]$$

After the analysis of the controller has been done in s domain, a digital implementation of the LPF $H_1(s)$ and the proportional/integrative controller $H_2(s)$ is done using the well known Z transform. Applying the Z transform on the LPF transfer function $H_1(s)$, the expression in z domain is given by:

$$H_1(z) = \frac{a}{1-(1-a)z^{-1}}, \text{ where } a = \omega_0 r. \quad [\text{Eq. 14}]$$

The above expression is a good approximation to perfect discretization of $H_1(z)$, since the loop bandwidth is very small compared with the symbol rate. Thus, $\omega_0 r \ll 1$ and the difference equation related to $H_1(z)$ is given by: $u[k]=u[k-1]+a \cdot (e[k]-u[k-1])$ where $e[k]$ and $u[k]$ are the input and output signals of the LPF, respectively. Since a is very small, the output $u[k]$ is accumulated in double precision.

Applying the Z transform on the proportional/integral controller transfer function $H_2(s)$, the expression in z domain is given by:

$$H_2(z) = K_1 + \frac{K_2}{1-z^{-1}}. \quad [\text{Eq. 15}]$$

$$y[k]=y[k-1]+(K_2/K_1)u[k] \quad [\text{Eq. 16}]$$

$$c[k]=(K_1)(u[k]+y[k]) \quad [\text{Eq. 17}]$$

where $u[k]$ is the output signal from the LPF, $y[k]$ is the state variable of the proportional/integral controller, and $c[k]$ is the output of the controller (control signal to the VCXO). In this case $K_1=1$ and since $K_2$ is very small, the output $y[k]$ is accumulated in double precision.

According to a preferred embodiment of the present invention, an 8 bit Digital to Analog Converter (DAC) 31, is used to generate the control signal for the VCXO, for an accurate, simple, cost-effective implementation. This requires rounding of $c[k]$ to be a relatively short number, which results in an unacceptable operation of the loop. The problem is overcome by a method based on the addition of a dither to the control signal $c[k]$, the duty-cycle of which is determined by the rounding error, comprising the following steps:

1) Defining an error $\tilde{c}[k]=c[k]-\hat{c}[k]$ between the double precision value $c[k]$ and its rounded value $\hat{c}[k]$.
2) Adding the error $\tilde{c}[k]$ to a secondary accumulator (integrator) with output $x[k]$. Hence, its output is given by:

$$x[k]=x[k-1]+\tilde{c}[k]. \quad [\text{Eq. 18}]$$

3) Correcting the rounded value of $\hat{c}[k]$ according to the value of $x[k]$. If the Least Significant Bit (LSB) of the DAC is b, the correction is given by:

$$x[k]>0.5b \rightarrow \hat{c}[k]=\hat{c}[k]+b, \ x[k]=x[k]-b,$$
$$x[k]<-0.5b \rightarrow \hat{c}[k]=\hat{c}[k]-b, \ x[k]=x[k]+b. \quad [\text{Eq. 19}]$$

$x[k]$ accumulated the error $\tilde{c}[k]$. If $x[k]$ becomes larger than $0.5b$, b is added to $\hat{c}[k]$ (compensation) and subtracted from $x[k]$ (for new error accumulation). If $x[k]$ becomes smaller than $-0.5b$, b is subtracted from $\hat{c}[k]$ and added to $x[k]$.

By using this mechanism, a very accurate control of the VCXO (which is critical to proper operation of the loop) is obtained with no need for a complex, expensive DAC. Correction is calculated continuously, and the control voltage to the VCXO is updated at the right timing, so as to obtain an accurate phase. Moreover, intensive digital implementation improves the temperature stability and power consumption of the VCXO control circuitry.

According to a preferred embodiment of the present invention, the method for BTR and error signal generation in blind mode employs a modification of Band-Edge Timing Recovery (BETR) method. Looking back at FIG. 5A, an algorithm for extracting the TRL phase error is described:

1) The incoming signal is sampled, demodulated, passes filters 13 and 14 and the resulting complex (I and Q) signal is fed to TRL 40. The resulting complex signal is given by:

$$z_r[n]+jz_i[n] \quad [\text{Eq. 20}]$$

2) This signal has bandwidth from $-0.5(1+\alpha)f_b$ to $0.5(1+\alpha)f_b$, where $f_b$ is the symbol rate and $\alpha$ is the bandwidth excess ratio. Therefore, the two band-edge components (base-band components at upper and lower frequencies) spectral lines can be recovered by multiplying the demodulated complex signal $z[n]$ by $\exp(j\pi f_b t)$ and $\exp(-j\pi f_b t)$.

According to a preferred embodiment of the invention, the sampling rate in blind mode is done at twice the symbol rate $f_b$. This method is known as Fractional Spaced Equalization (FSE), which is utilized for reducing the line amplitude and delay distortions appearing when the signal is sampled at the symbol rate.

Since the sampling frequency is $2f_b$, the signal is multiplied by the discrete-time sequences $\exp(j0.5\pi n)$ and $\exp(-j0.5\pi n)$. Therefore, the band-edge components can be formed without any multiplication, which is one of the main advantages of the present invention. The lower band edge component is given by:

$$\lambda_r[n]+j\lambda_i[n] \quad\quad [Eq.\ 21]$$

The upper band edge component is given by:

$$\mu_r[n]+j\mu_i[n] \quad\quad [Eq.\ 22]$$

where $$\lambda_r[n]=z_r[n]\cos(0.5\pi n)-z_i[n]\sin(0.5\pi n),$$

$$\lambda_i[n]=z_i[n]\cos(0.5\pi n)+z_r[n]\sin(0.5\pi n),\ \cos(0.5\pi n)=\ldots,1,0,-1,0,\ldots$$

$$\mu_r[n]=z_r[n]\cos(0.5\pi n)+z_i[n]\sin(0.5\pi n),\ \sin(0.5\pi n)=\ldots,0,1,0,-1,\ldots$$

$$\mu_i[n]=z_i[n]\cos(0.5\pi n)-z_r[n]\sin(0.5\pi n), \quad\quad [Eq.\ 23]$$

Each of the components $\lambda_r[n], \lambda_i[n], \mu_r[n], \mu_i[n]$ is filtered by LPF 21, 22, 23 and 24 respectively, forming a set of filtered values: $\bar{\lambda}_r[n], \bar{\lambda}_i[n], \bar{\mu}_r[n], \bar{\mu}_i[n]$.

These values are multiplied and summed by the spectral line computer 25, and then filtered again by LPF 26 and 27 respectively, in a way forming the I and Q component of the desired spectral line vector $v[n]$. Hence, the components of the spectral line vector $v[n]=v_r[n]+jv_i[n]$ are given by:

$$v_r[n]=\bar{\lambda}_r[n]\bar{\mu}_r[n]+\bar{\lambda}_i[n]\bar{\mu}_i[n],$$

$$v_i[n]=\bar{\lambda}_i[n]\bar{\mu}_r[n]-\bar{\lambda}_r[n]\bar{\mu}_i[n], \quad\quad [Eq.\ 24]$$

The phase of the spectral line vector is given by:

$$\tan^{-1}(v_i[n]/v_r[n]) \quad\quad [Eq.\ 25]$$

Since the phase error is small, the approximations $x \approx \sin x \approx tg x$ and $e(t) \approx \sin[\phi_{in}(t)-\phi(t)] \approx \phi_{in}(t)-\phi(t)$ may be used. Therefore, the phase error of the timing loop is proportional to $v_i[n]$. The proportionality factor is a function of the signal amplitude which may vary. Therefore, $v[n]=v_r[n]+jv_i[n]$ is fed to an amplitude normalizer 28, which normalizes the magnitude of $v_r[n]+jv_i[n]$ to be 1. This normalization is achieved by a widely used Automatic Gain Control (AGC) circuitry. After normalization, the normalized imaginary part of the spectral line, which is the required error signal of the loop, is sampled again at the symbol rate $f_b$, and fed to the controller 29 to lock the loop. From this point, blind equalization is performed until symbol error rate of less than $10^{-3}$ (or any other desired error rate) is achieved. Using the preferred embodiment of the present invention described above, blind equalization is accomplished in less than 0.1 Sec.

Figure 5B:
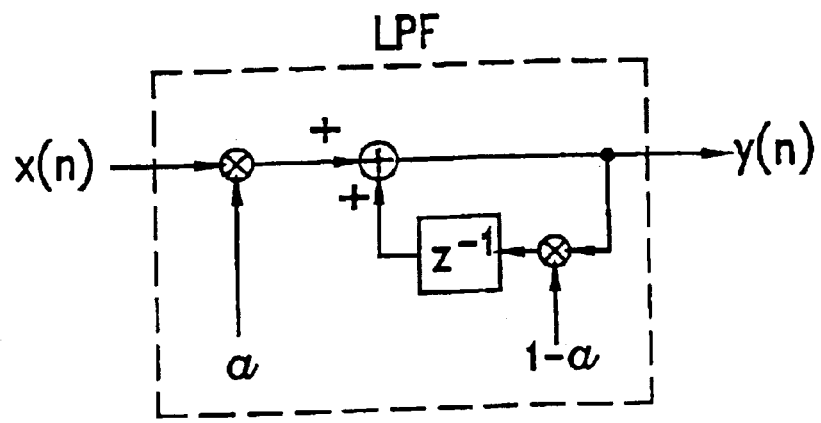
FIG. 5B is a block diagram of a first order low-pass filter of FIG. 5A.

All the LPFs of TRL 40 are first-order Infinite Impulse Response (IIR) filters. FIG. 5B is a block-diagram of this filter, and its mathematical representation is given at Eq. 14 above. Going back to the Z domain, the output Y(z) is multiplied by $(1-\alpha)$, time shifted by T, and added to the input X(z) multiplied by $\alpha$. According to the invention, $\alpha$ is selected to be $\alpha=2^{-k}$ (k is an integer), leading to the filter's difference equation:

$$y[n]=y[n-1]+2^{-k}(x[n]-y[n-1]) \quad\quad [Eq.\ 26]$$

Since $2^{-k}$ is equivalent to a time-shift k, each LPF may be realized with no need for any multiplication.

According to a preferred embodiment of the present invention, a reduced constellation is transmitted by the master modem for the blind mode operation. This reduced constellation comprises only four symbols, each having the same amplitude. This method simplifies the equalization during blind mode, since the symbols differ from each other only in their phase. After equalization using reduced constellation, the line characteristics has been "extracted" and full constellation is started.

Figure 8:
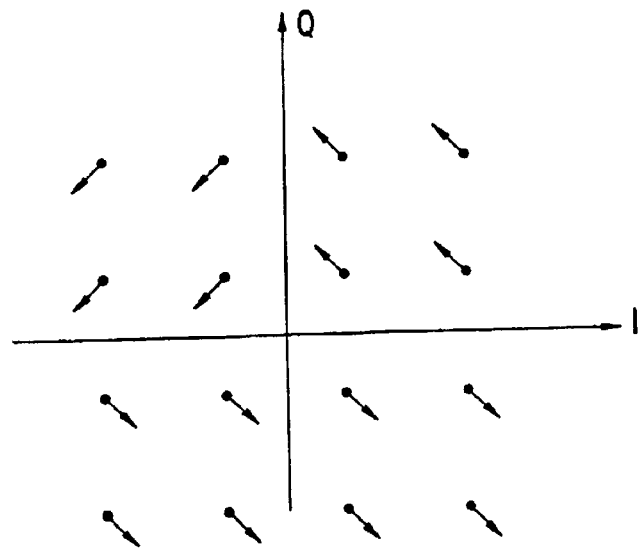
FIG. 8 schematically illustrates the phase shift of a 16 QAM constellation resulting from frequency mismatch between master and slave modems clock.

After blind equalization, the slave modem switches to the well known DDTR mode, as mentioned above. The operation of this mode is illustrated in FIG. 8, in which a 16 QAM constellation is presented. If there is any offset between the clock frequencies of the master and slave modems, phase error is generated, shifting the phase of any symbol in time. This shift is illustrated by arrows pointing towards the shifting direction of the phase. These phase shifts are detected by measuring the deviations of pre-detected symbols to from their post-detected symbols, and as a result the loop is adjusted to shift the VCXO frequency to the direction that minimizes the clusters that are generated around each state of the constellation. Since blind equalization has been already implemented, these clusters are relatively small, and the DDTR mode is utilized to maintain only fine corrections.

All the above description and examples have been provided for the purpose of illustration, and are not intended to limit the invention any way. Many modifications and additional operations can be effected in the method, and many different hardware elements, wiring and components can be used, all without exceeding the scope of the invention.

What is claimed is:

1. A method for fast clock timing recovery of transmitted data between a master $\chi$DSL modem and a slave $\chi$DSL modem wherein said data is submitted over an $\chi$DSL transmission medium comprising the step of:

(a) providing the master $\chi$DSL modem, synchronized by its own timing clock, for data transmission, (b) providing the slave $\chi$DSL modem, synchronized by its own timing clock, for data reception, (c) providing the $\chi$DSL transmission medium connecting the master $\chi$DSL and the slave $\chi$DSL modems, (d) encoding and transmitting the data at the master $\chi$DSL modem as said sequence of symbols using predetermined QAM states, a sequence having a frequency, (e) receiving the data at the slave $\chi$DSL modem as said sequence of symbols, (f) sampling the received data at a symbol rate and converting the sampled data into digital form, (g) splitting the digitally converted data into in-phase (I) and quadrature (Q) channels, (h) low-pass filtering of the digitally converted data corresponding to the in-phase and quadrature channels, (i1) re-sampling the filtered data at a re-sampling rate which is at least twice the symbol rate, (i2) modulating each of said re-sampled data with the two discrete-time sequences:
   $\cos(0.5\ \pi n)=\ldots,1,0,-1,0,\ldots$
   $\sin(0.5\ \pi n)=\ldots,0,1,0,-1,\ldots$ (i3) computing a normalized spectral line vector corresponding to the re-sampled modulated data, (i4) tuning the symbol rate in dependence of the imaginary part of the normalized spectral line vector for tracking the frequency of the sequence of symbols.

2. The method according to claim 1 wherein the step h) of low-pass filtering comprises filtering each channel with digital low-pass filters, said filters being matched to transmitting filters at the master χDSL modem; and the steps i1) to i4) comprise turning the clock timing recovery into a blind mode, by the steps of:

(a) re-sampling the filtered I and Q data at twice the symbol rate;

(b) extracting lower and upper band edge components by modulating each of the sampled sequence of I and Q data of step (a) above with the said two discrete time sequences;

(c) filtering the four resulting products with four first order low-pass filters and re-sampling the results at the symbol rate;

(d) computing real and imaginary parts of the corresponding spectral line vector using the products of step (c) above;

(e) filtering both the real and the imaginary parts of step (d) above, using another first order low-pass filter;

(f) normalizing the magnitude of a spectral line vector to unity using a suitable automatic gain control circuitry;

(g) extracting the phase of the spectral line vector from the normalized imaginary part of step (f) above;

(h) feeding the imaginary part of step (g) above as a phase-error signal to a controller of a phase-locked loop (PLL), said controller outputting a digital control signal, said PLL utilizing a frequency controlled clock tracking oscillator, the frequency of which is tuned to track the frequency of the received sequence of symbols or a clock frequency of the master χDSL modem;

(i) converting the digital control signal to an analog control voltage supplied to the frequency controlled clock tracking oscillator of step (h) above, using a Digital to Analog Converter (DAC); and (j) using an accumulator to correct the digital control signal supplied to the DAC of step (i) above.

3. The method according to claim 2 wherein the method further comprises the steps:

(a) feeding the filtered I and Q data to a complex linear equalizer for coarse phase and amplitude error correction;

(b) computing symbol state data decisions and outputting said symbol state data decisions using a slicer;

(c) fine equalization of channel distortions by feeding the I and Q outputs of the slicer to a decision feedback equalizer, the I and Q outputs of which are extracted from the slicer;

(d) computing an extracted symbol error rate at the slicer outputs; and (e) after an error probability decreases to a given BER, switching from a blind timing recovery mode to a data directed timing recovery mode.

4. The method according to claim 1 wherein the χDSL transmission medium is a pair of copper wires.

5. The method according to claim 1 wherein the copper wires are telephone lines.

6. The method according to claim 2 wherein the frequency controlled clock tracking oscillator utilized by the PLL is a Voltage-Controlled Crystal Oscillator (VCXO).

7. The method according to claim 2 wherein the blind timing recovery mode is achieved using a reduced constellation.

8. The method according to claim 7 wherein the reduced constellation comprises only equal amplitude symbols.

9. The method according to claim 2 wherein the blind timing recovery mode is achieved using a full constellation.

10. The method according to claim 2 wherein the digital control signal of the PLL tracking oscillator is provided accurately in double precision and converted using an up to 8 bit DAC means, the method further comprising the steps of:

(a) rounding a double precision control signal;

(b) generating an error signal between a double precision value and a rounded value;

(c) accumulating the error signal in an accumulator;

(d) adding the error signal to the output signal of the accumulator;

(e) comparing the result of step d) above with half the value of the DAC's LSB;

(f) compensating the rounded value according to the result of step e) above by the steps of:

(g) adding the value of the DAC's LSB to the accumulator output, if the result of step d) is larger than half the value of the DAC's LSB; or (h) subtracting the value of the DAC's LSB from the accumulator output, if the result of step d) is smaller than half the value of the DAC's LSB.

11. An χDSL master modem for fast clock timing recovery from a received data signal, said data signal is transmitted by the master χDSL modem and transferred over an XDLS-transmission medium, comprising:

an input for receiving the transmitted data signal comprising a sequence of symbols, said sequence having a frequency;

an analog to Digital Converter connected to the input for sampling and digitizing the received data signal at a symbol rate;

two first multipliers connected to the Analog to Digital Converter for splitting the sampled and digitized data signal into in-phase (I) and quadrature (Q) channels, one of said two first multipliers being phase-shifted by 90°;

two first digital low-pass filters for filtering each channel, said filters being connected to the two first multipliers and being matched to transmitting filters at the χDSL master modem;

a clock timing recovery circuit operating in blind mode, comprising:

means for sampling the filtered I and Q channels at twice the symbol rate;

four second multipliers connected to the sampling means for modulating each of the sampled sequence of I and Q channels with two discrete time sequences:

$\cos(0.5\ \pi n) = \ldots, 1, 0, -1, 0, \ldots$ $\sin(0.5\ \pi n) = \ldots, 0, 1, 0, -1, \ldots$ for extracting lower and upper band edge components;

four second first order low-pass filters connected to the four second multipliers for filtering the four resulting products of the four second multipliers and for resampling the results at the symbol rate;

a spectral line computer connected to the four second first order low-pass filters for computing real and imaginary parts of a spectral line vector;

at least one third first order low-pass filter connected to the spectral line computer for filtering both the real and the imaginary parts of the spectral line vector;

a spectral line normalizing the magnitude of the spectral line vector to unity using a suitable automatic gain control circuitry;

a controller connected to the spectral line normalizer, the controller being part of a phase-locked loop (PLL) and said controller outputting a digital control signal, said PLL utilizing a frequency controlled clock tracking oscillator, the frequency of which is tuned to track the frequency of the received sequence of symbols or a clock frequency of the χDSL master modem;

a Digital to Analog Converter (DAC) connected to the controller for converting the digital control signal to an analog control voltage supplied to the frequency controlled clock tracking oscillator of the PLL;

a complex linear equalizer connected to the two first multipliers for coarse phase and amplitude error correction;

a slicer circuitry connected to the complex linear equalizer for computing and outputting I and Q symbol state data decisions;

a decision feedback equalizer connected to the outputs of the slicer circuitry and connected via an adder to the slicer circuitry input for fine equalizing channel distortions;

circuitry connected to the outputs of the slicer circuitry for computing an extracted symbol error rate; and circuitry for switching from a blind timing recovery mode to a data directed timing recovery mode, once the extracted symbol error rate is reduced to less than a given BER.

12. The χDSL master modem according to claim 11 wherein the χDSL master modem further comprises:

a circuitry for accumulation to correct the digital control signal supplied to the DAC, said digital control signal having double precision accuracy, comprising:

circuitry for rounding a double precision digital control signal;

circuitry for generation of an error signal between a double precision value and a rounded value;

circuitry for accumulation of the error signal in an accumulator;

a first adder for adding the error signal to the output signal of the accumulator;

a comparator for comparing the output of the first adder with half the value of the DAC's LSB;

a second adder for compensating the rounded value according to the result of the comparator by adding the value of the DAC's LSB to the accumulator output, if the result of the comparator is larger than half the value of the DAC's LSB, or, subtracting the value of the DAC's LSB from the accumulator output, if the result of the comparator is smaller than half the value of the DAC's LSB.

* * * * *